United States Patent [19]

Story

[11] Patent Number: 5,138,317

[45] Date of Patent: Aug. 11, 1992

[54] DIGITAL TO ANALOGUE CONVERTER ADAPTED TO SELECT INPUT SOURCES BASED ON A PRESELECTED ALGORITHM ONCE PER CYCLE OF A SAMPLING SIGNAL

[75] Inventor: Michael J. Story, Whittlesford, England

[73] Assignee: Data Conversion Systems Limited, Cambridge, England

[21] Appl. No.: 555,162

[22] PCT Filed: Feb. 10, 1989

[86] PCT No.: PCT/GB89/00112

§ 371 Date: Oct. 9, 1990

§ 102(e) Date: Oct. 9, 1990

[87] PCT Pub. No.: WO89/07862

PCT Pub. Date: Aug. 24, 1989

[30] Foreign Application Priority Data

Feb. 17, 1988 [GB] United Kingdom ............. 8803627

[51] Int. Cl.$^5$ ............................................. H03M 1/74
[52] U.S. Cl. ........................................ 341/144; 341/141
[58] Field of Search ..................... 341/144, 153, 141

[56] References Cited

U.S. PATENT DOCUMENTS

| | | | |
|---|---|---|---|
| 3,982,172 | 9/1976 | van de Plassche | 323/317 |
| 4,695,826 | 9/1987 | Ando et al. | 341/144 |
| 4,703,310 | 10/1987 | van de Plassche | 341/144 |
| 4,791,406 | 12/1988 | Mehrgardt et al. | 341/144 |
| 4,864,215 | 9/1989 | Schouwenaars et al. | 341/144 |
| 4,935,740 | 6/1990 | Schouwenaars et al. | 341/153 |
| 4,935,741 | 6/1990 | Reich | 341/144 |

*Primary Examiner*—Howard L. Williams
*Attorney, Agent, or Firm*—Lee, Mann, Smith, McWilliams, Sweeney & Ohlson

[57] ABSTRACT

An n-bit DAC of the kind having at least $2^n - 1$ sources, typically current sources, especially for use in oversampling ADC's enables a resolution accuracy in excess of 18 bits by selecting the sources in a dynamic manner. A source selection circuit typically an at least $2^n - 1$ to $2^n - 1$ multiplexer, connected between the digital input lines and the DAC switches selects the sources based on a predetermined cyclic algorithm which converts DAC errors into noise and shifts the noise energy into unwanted parts of the spectrum.

6 Claims, 4 Drawing Sheets

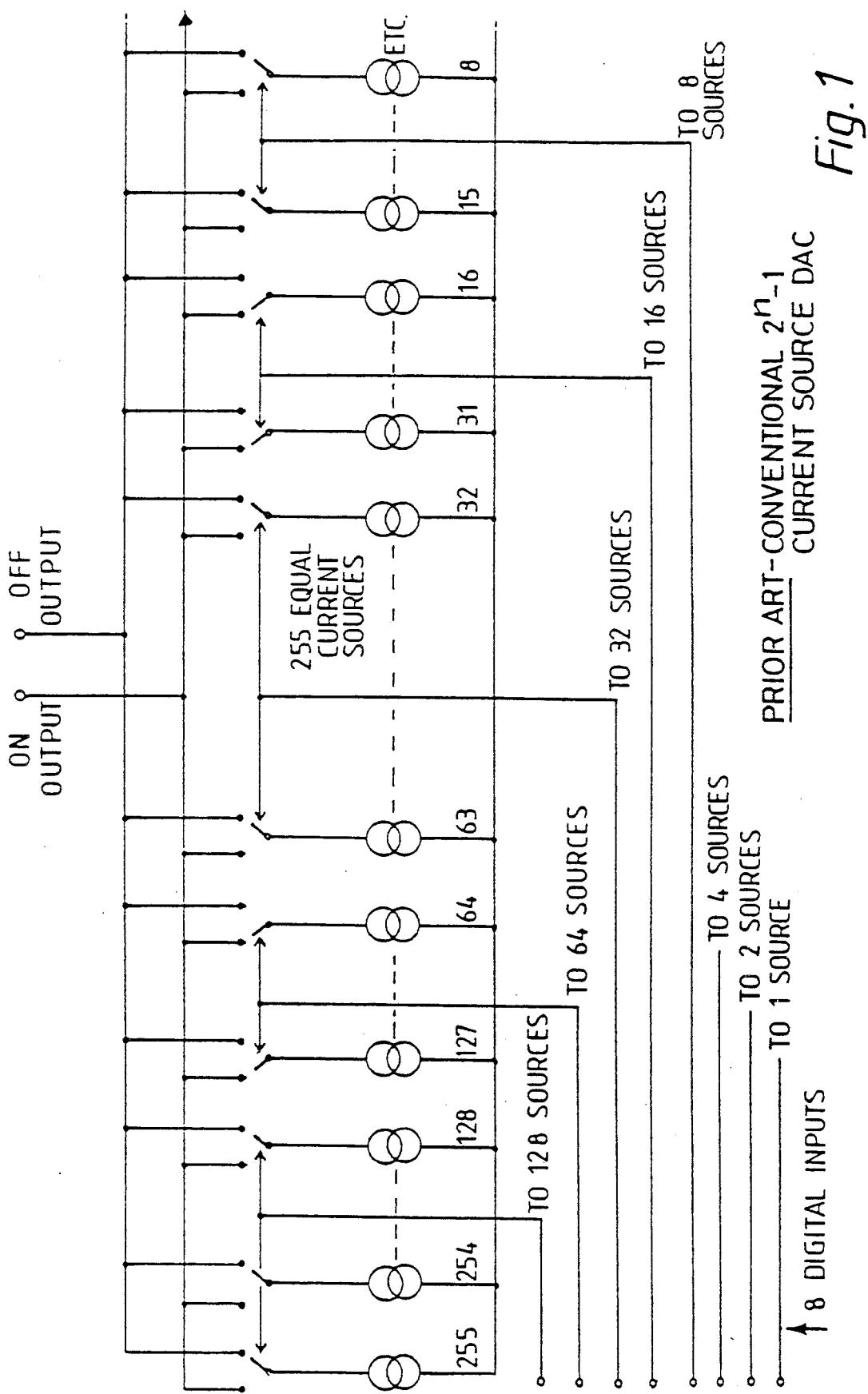

LOW HARDWARE IMPLEMENTATION OF INVENTION

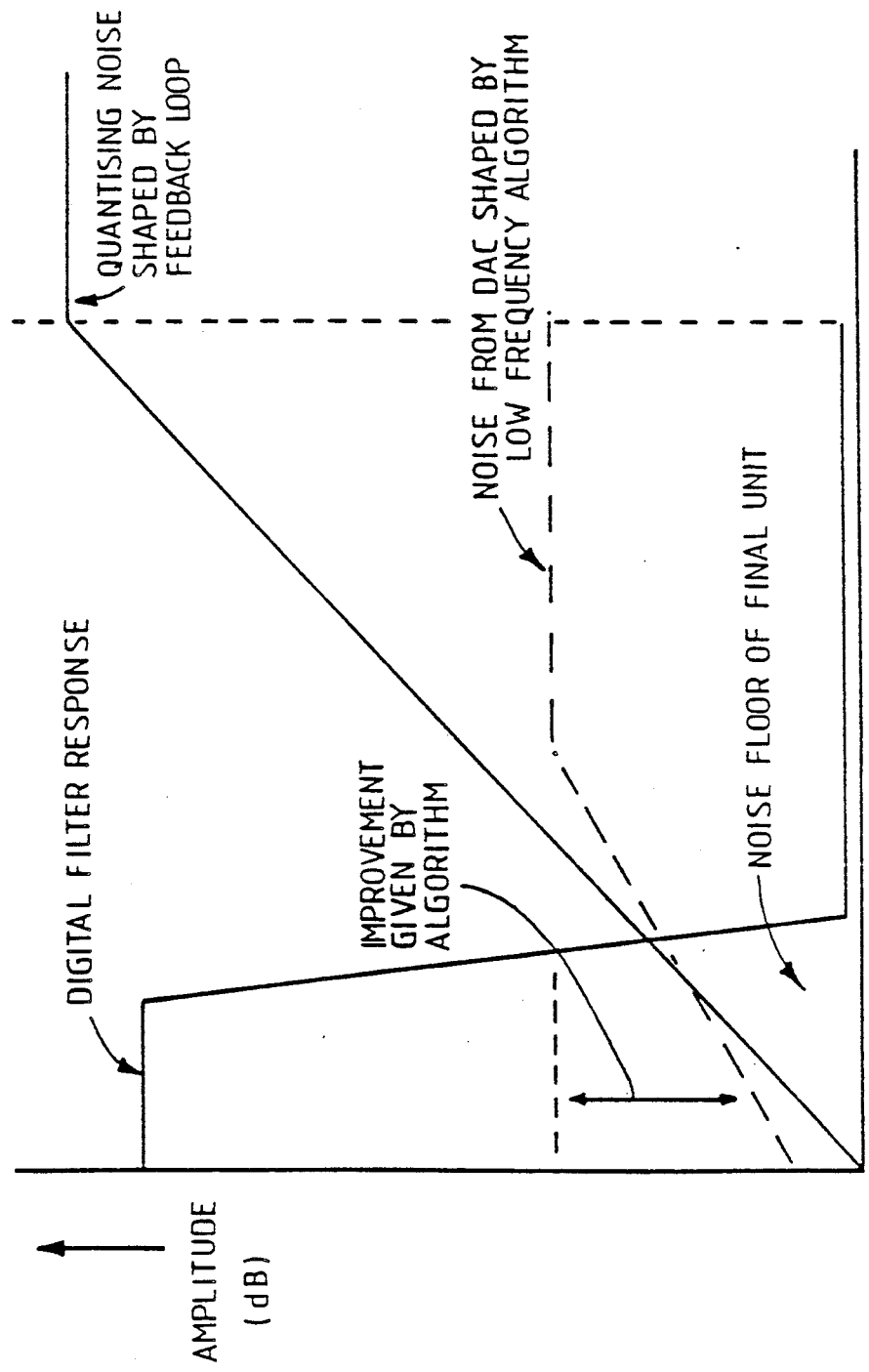

DIGITAL TO ANALOGUE CONVERTER ADAPTED TO SELECT INPUT SOURCES BASED ON A PRESELECTED ALGORITHM ONCE PER CYCLE OF A SAMPLING SIGNAL

FIELD OF INVENTION

This invention relates to a digital to analogue converter (DAC) and in particular to an n bit DAC of the kind having at least $2^n-1$ sources, where the sources may be current, charge or voltage sources, most typically current sources.

The DAC of the invention is intended more especially but not exclusively for use in oversampling analogue to digital converters (ADC's).

BACKGROUND TO THE INVENTION

A DAC is a device that will output an analogue parameter, usually a voltage, current, or charge, that is representation of a digital input to it. Thus an 8 bit digital word can have one of 256 values, so an 8 bit DAC will output a voltage or current which can have one of 256 different values. Since the analogue values which can be output are limited in number, any particular analogue value produced is accurate only within upper and lower limits. Thus, digitally, each one of the 256 different values is precisely defined, whereas the analogue output can only have a defined degree of accuracy associated with it. There is not absolute agreement on the precise definition of accuracy, but an 8 bit; 8 bit accuracy DAC will output analogue voltage or currents which are +/−0.5 lsbs accurate.

Multibit high accuracy oversampling ACDs require DACs which have relatively few bits (say 4 to 8) and are very accurate (say +/−0.01 lsbs). Another way of describing the accuracy required is that a DAC of n bits with m bit accuracy is needed, where m>n. Such DACs are very difficult to construct and 16 bits for m is the currently available limit, although in theory 18 bits or more would be required.

There exist many ways of constructing DACs. For example, DACs may incorporate current sources, where the current sources have different values. One conventional technique is, for an 8 bit DAC, to use 8 current sources which are each a factor of 2 larger than the next one. One digital input control line is then connected to each current source. Another technique, feasible with the advent of VLSI, for the same 8 bit DAC, is to use 255 equal current sources, where the msb digital control line switches on 128 sources, the next switches 64, the next 32, and so on, as diagrammatically indicated in FIG. 1. It is to be noted that an n bit DAC needs at least $2^n-1$ current sources. Various combinations of these approaches have also been used, such as 16 equal current sources, followed by another 4 sources which are each half the magnitude of the preceding one, for an 8 bit DAC.

Oversampling ADCs put a low accuracy ADC with an accurate DAC in a feedback loop, and sample the signal many (e.g. 128) times faster than the required rate. The effect of the feedback loop is to correlate up quantising noise from the ADC in such a way that the noise spectrum is shaped, and is very low in the required part of the spectrum. A digital filter on the output of the ADC then filters out all signals (including noise) from the unwanted parts of the spectrum, and then decimates the output data rate, frequency shifting it if necessary. The wanted part of the spectrum is usually, but not always, the low frequency part (e.g. the first 1/128th) of the spectrum.

THE INVENTION

According to the invention, an n bit DAC of the kind described, having at least $2^n-1$ sources switched by at least $2^n-1$ switches responsively to inputs on at least $2^n-1$ digital input lines, includes a source selection circuit, connected between the digital input lines and the source switches, which is adapted to select the sources in a dynamic manner, based on a preselected algorithm.

The closest prior art approach to this technique is to select the sources randomly. The present invention shows substantial advantages over both selection in an absolutely fixed manner and random selection.

For further understanding, when the invention is applied to a 4 bit DAC, for example, one conversion may require the digital word "3" to be converted, and current sources 2, 5, 8 are chosen, whilst on the next conversion, to convert "3" sources 11, 16, 4 are chosen, etc.

The selection algorithm is desirably chosen first of all to convert DAC errors into noise, and secondly and most importantly to put all (or most) of that noise energy in the unwanted parts of the spectrum. The mechanism by which is does this is different from the way a basic oversampling ADC works and is entirely dependent on the algorithm.

BRIEF DESCRIPTION OF DRAWINGS

The DAC in accordance with the invention is exemplified with reference to the accompanying drawings, in which:

FIG. 1 shows a conventional DAC;

FIG. 3 is a diagram showing the noise spectrum of a DAC in accordance with the invention.

DESCRIPTION OF EMBODIMENT

Figure 2A:
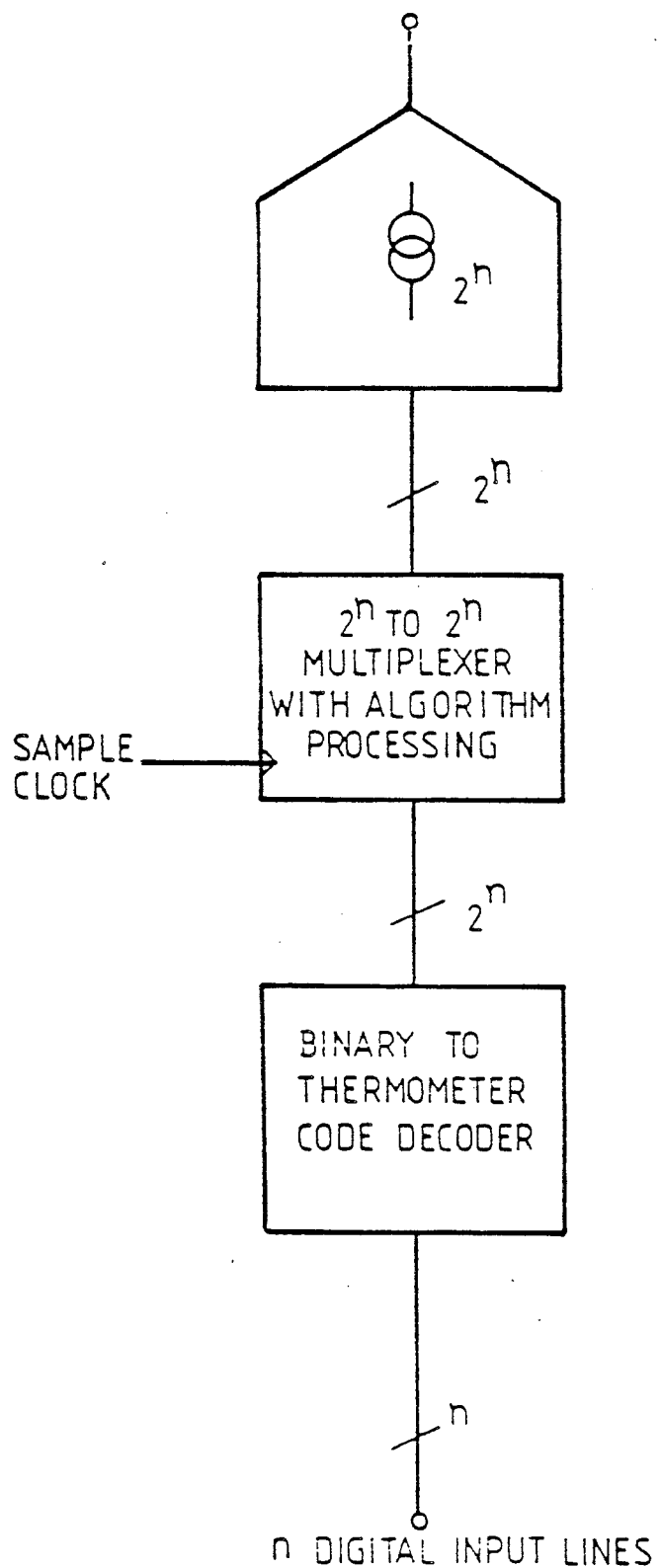
FIG. 2A is a block diagram for illustrating the invention.

Referring to FIG. 2, an n-bit DAC in accordance with the invention has $2^n$ current sources (one more than is absolutely necessary) and operates in accordance with an algorithm, on the basis of which the current sources are selected in the following manner. A digital input requiring s1 current sources to be turned on selects the first s1. The next conversion requires s2 current sources, and selects s2, starting from s1+1. If this requires sources beyond 2s, counting starts again from the beginning, and the final source used is designated q(L). The next conversion requires s3 sources, and selects s3 using q(L+1) as the first. The process continues ad infinitum. The block diagram of FIG. 2A illustrates the basic system.

Figure 2B:
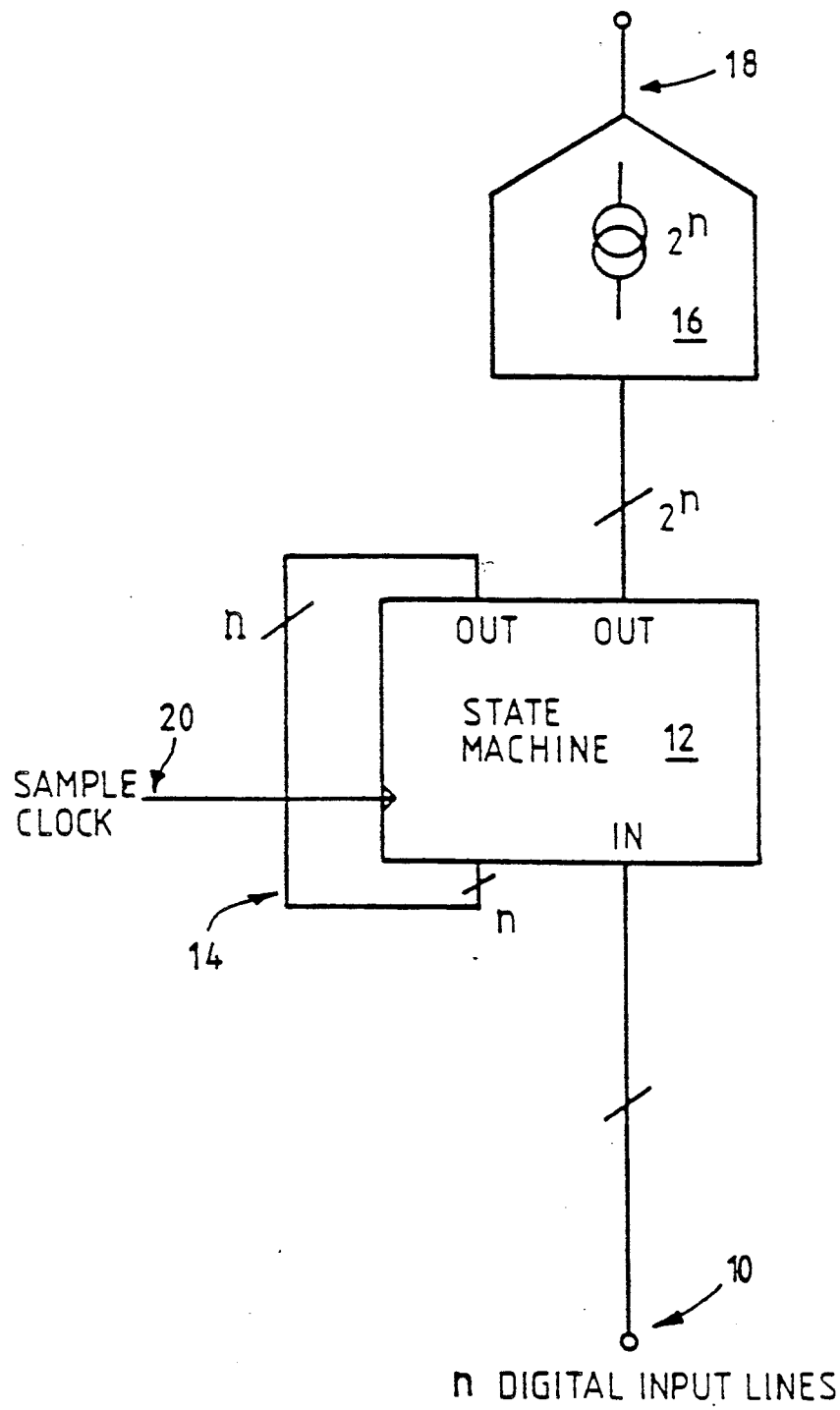
FIG. 2B diagrammatically illustrates one embodiment of DAC in accordance with the invention.

In FIG. 2B, showing a low hardware implementation of the invention, reference 10 denotes the n digital inputs. A decoder operating in accordance with the algorithm is referenced 12, and is associated with an n-loop feedback circuit 14 for shaping the quantising noise. Reference 16 denotes the switchable current sources and reference 18 designates the output. A sample clock input to the decoder is referenced 20.

FIG. 3 shows the noise spectrum of the DAC in accordance with the invention, and is labelled in self-explanatory manner.

The algorithm producing the noise spectrum of FIG. 3 can reduce the accuracy requirements for the current sources by at least a factor of 30 in an oversampling ADC using a 3 bit DAC, and oversampling by at least 16 times. It makes feasible multibit oversamplers with a resolution substantially in excess of 18 bits.

I claim:

1. An n bit DAC for converting a digital signal into an analogue signal, the DAC comprising:
   a sampling clock for generating a sampling signal to trigger sampling of the digital signal to give a succession of digital inputs;
   at least $2^n-1$ digital input lines to which the digital signals are fed in succession;
   at least $2^n-1$ current charge or voltage sources of substantially the same magnitude;
   at least $2^n-1$ source switches, each associated with a respective source and operable to switch that source in response to an input of a digital input line;
   a source selection circuit connected between the input lines and the source switches, operable to select, for each input line, which source switch is to be responsive to an input on that line, the source selection circuit comprising a $2^n-1$ to $2^n-1$ digital switching circuit;
   an input on the digital switching circuit connected to the sampling clock, which triggers the source selection circuit to change the selection of switches in accordance with a pre-determined algorithm once per cycle of the sampling signal, wherein said selection is not changed during conversion of any given digital input, and the change of selection from input to input converts errors in the magnitudes of the sources into signals appearing in the unwanted part of the spectrum of the converted signal.

2. An n-bit DAC according to claim 1 wherein the source selection circuit comprises an at least $2^n-1$ to $2^n-1$ multiplexer having algorithm processing, stepped by a clocked input.

3. An n-bit DAC according to claim 1 wherein the source selection circuit comprises a decoder operating in accordance with the algorithm responsively to a clocked input, and an n-loop feedback circuit connected to the decoder and for shaping the quantising noise.

4. An n bit DAC according to claim 1 having $2^n$ current sources, the digital switching circuit including control means whereby a first digital input turns on s1 current sources to effect digital to analogue conversion, a second digital input turns on s2 current sources to effect digital to analogue conversion, the selection of said s2 sources commencing from the sources s1+1, said source control means continuing at each digital input to select sources in this way until at any selection step the number of selected sources exceeds $2^n$, whereupon source selection recommences at the first source.

5. An n-bit DAC according to claim 4, wherein the source selection circuit comprises an at least $2^n-1$ to $2^n-1$ multiplexer having algorithm process, stepped by a clocked input.

6. An n-bit DAC according to claim 4 wherein the source selection circuit comprises a decoder operating in accordance with the algorithm responsively to a clocked input, and an n-loop feedback circuit connected to the decoder and for shaping the quantising noise.

* * * * *